US009875034B2

(12) United States Patent
Sethuraman et al.

(10) Patent No.: US 9,875,034 B2
(45) Date of Patent: Jan. 23, 2018

(54) DELAYING PROGRAMMING REQUESTS IN FLASH MEMORY

(71) Applicant: International Business Machines Corporation, Armonk, NY (US)

(72) Inventors: Saravanan Sethuraman, Bangalore (IN); Gary A Tressler, Sandy Hook, CT (US); Harish Venkataraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/093,243

(22) Filed: Apr. 7, 2016

(65) Prior Publication Data

US 2017/0293425 A1 Oct. 12, 2017

(51) Int. Cl.
*G06F 12/00* (2006.01)
*G06F 3/06* (2006.01)

(52) U.S. Cl.
CPC .............. *G06F 3/061* (2013.01); *G06F 3/064* (2013.01); *G06F 3/0652* (2013.01); *G06F 3/0656* (2013.01); *G06F 3/0659* (2013.01); *G06F 3/0679* (2013.01)

(58) Field of Classification Search
CPC .. G06F 12/00; G06F 12/0238; G06F 12/0246; G06F 3/0679
USPC .......................................... 711/100, 103, 154
See application file for complete search history.

(56) References Cited

U.S. PATENT DOCUMENTS

| 8,103,841 | B2 | 1/2012 | Sinclair et al. |
| 8,270,238 | B2 | 9/2012 | Norman |
| 8,437,192 | B2 | 5/2013 | Lung et al. |
| 8,867,280 | B2 | 10/2014 | Park et al. |
| 9,007,835 | B2 | 4/2015 | Meir et al. |

(Continued)

FOREIGN PATENT DOCUMENTS

TW            201419285 A        5/2014

OTHER PUBLICATIONS

Chang, Y. M., Chang, Y. H., Kuo, T. W. et al. (2013). A disturb alleviation scheme for 3D flash memory. In Proceedings of the ntemational Conference on Computer-Aided Design, IEEE Press, 421-428.

(Continued)

*Primary Examiner* — Tuan Thai
(74) *Attorney, Agent, or Firm* — Patterson + Sheridan, LLP

(57) ABSTRACT

Embodiments herein describe a memory system that queues program requests to a block of flash memory until a predefined threshold is reached. That is, instead of performing program requests to write data into the block as the requests are received, the memory system queues the requests until the threshold is satisfied. Once the buffer for the block includes the threshold amount of program requests, the memory system performs the stored requests. In one embodiment, the memory system erases all the pages in the block before writing the new data in the program requests into the destination pages. The data that was originally stored in the pages that are not destination pages is rewritten into the pages. In this example, the queued program requests can be written into the pages using one erase and write step rather than individual erase and write steps for each of the requests.

14 Claims, 4 Drawing Sheets

(56) References Cited

U.S. PATENT DOCUMENTS

2011/0026318 A1* 2/2011 Franceschini ....... G06F 13/1642
                                                    365/163
2014/0146612 A1    5/2014 Helm et al.
2014/0239380 A1    8/2014 Lin et al.
2017/0123972 A1*   5/2017 Gopinath ............ G06F 12/0253
2017/0123991 A1*   5/2017 Sela .................... G06F 12/0868

OTHER PUBLICATIONS

Chen, C. P., Lue, H. T., Chang, K. P. et al. (2012). A highly pitch scalable 3D vertical gate (VG) NAND flash decoded by a novel self-aligned independently controlled double gate (IDG) string select transistor (SSL). IEEE, 91-92.

Kim, J., Hong, A. J., Kim, S. M. et al. (2011). A stacked memory device on logic 3D technlogy for ultra-high-density data storage. Nanotechnology, 22(25), 1-7.

Kim, Y., Yun, J. G., Park, S. H. et al. (2012). Three dimensional NAND flash architecture design based on single crystalline stacked array. Electron Devices, IEEE Transactions on, 59(1), 35-45.

* cited by examiner

DELAYING PROGRAMMING REQUESTS IN FLASH MEMORY

BACKGROUND

The present invention relates to operating a flash memory, and more specifically, to delaying program requests (i.e., write requests) to blocks in flash memory.

Flash memory is an electronic non-volatile computer storage medium that can be electrically erased and reprogrammed. There are two main types of flash memory, which are named after the NAND and NOR logic gates. A NAND flash is typically organized in blocks (e.g., 128 bytes of data of data) that each include multiple pages.

SUMMARY

One embodiment of the present invention is a memory system that includes a NAND flash memory array comprising a plurality of data blocks that each includes a plurality of pages and a controller. The controller is configured to receive a program request to write data into a first block of the data blocks and evaluate the program request and a plurality of previously queued program requests to determine if a threshold corresponding to the first block is satisfied, where each of the plurality of previously queued program requests writes data to the first block. The controller is configured to execute the program request and the plurality of queued program requests only upon determining the threshold is satisfied.

Another embodiment of the present invention is a method of operating a NAND flash memory comprising a plurality of data blocks that each includes a plurality of pages. The method includes receiving a program request to write data into a first block of the data blocks and evaluating the program request and a plurality of previously queued program requests to determine if a threshold corresponding to the first block is satisfied, where each of the plurality of previously queued program requests writes data to the first block. The method includes executing, upon determining the threshold is satisfied, the program request and the plurality of queued program requests.

Another embodiment of the present invention is an integrated circuit that includes a controller configured to receive a program request to write data into a first block of data blocks in a NAND flash memory and evaluate the program request and a plurality of previously queued program requests to determine if a threshold corresponding to the first block is satisfied, where each of the plurality of previously queued program requests writes data to the first block. The controller is configured to execute the program request and the plurality of queued program requests only upon determining the threshold is satisfied.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe a memory system that queues program requests (i.e., write requests) to a block of flash memory until a predefined threshold is reached. That is, instead of performing program requests to write data into the block as the requests are received, the memory system queues the requests until a threshold number of requests are received. Once the buffer for the block includes the threshold amount of program requests, the memory system performs the stored requests. In one embodiment, the memory system erases all the pages in the block before writing the new data into the destination pages in the blocks. In this example, the queued program requests can be written into the pages using one erase and write step rather than individual erase and write steps for each of the requests.

In another embodiment, a 3D flash memory system includes multiple blocks where each block contains multiple pages arranged in a vertical stack. Instead of having a single command line indicating whether a read or program is to be performed, separate command lines are coupled to each of the blocks. As a result, if the memory system identifies a read request and a program request to different blocks, the requests can be performed in parallel. In one embodiment, a program command line is used to perform a program request on a first block while a read command line is used to perform a read request on a second block in the 3D flash memory system in parallel. Furthermore, because a program request can take much longer to complete than a read request, the 3D flash memory system can perform multiple read requests in parallel with the program request.

Figure 1:
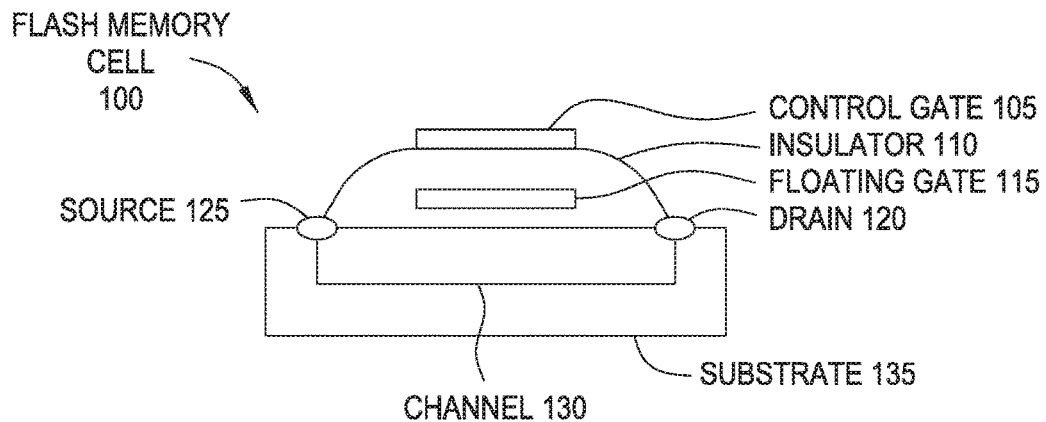
FIG. 1 is a cross section of a flash memory cell, according to one embodiment described herein.

FIG. 1 is a cross section of a flash memory cell 100 that stores one bit of data—i.e., a logical one or zero. The memory cell 100 includes a control gate 105, a floating gate 115, source 125, and drain 120. In operation, different voltages are driven onto the control gate 105, source 125, and drain 120 in order to store charge in the floating gate 115. As shown, the floating gate 115 is electrically isolated from the control gate 105, source 125, and drain 120 by an insulator 110. That is, the insulator 110 completely surrounds the floating gate 115. In one embodiment, the voltages of the control gate 105, source 125, and drain 120 cause negative charge carriers (i.e., electrons) to accumulate on the floating gate 115. Assuming a positive voltage is driven on the control gate 105 and a negative voltage is driven on the source 125 and drain 120, if the voltage difference is large enough, electrons tunnel through the insulator 110 thereby generating a current between a channel 130 and the floating gate 115. This current results in electrons accumulating on the floating gate 115. Conversely, the voltages on the control gate 105, source 125, and drain 120 can be driven to cause electrons to leave the floating gate 115. In one embodiment, if the floating gate 115 stores electrons (e.g., has a threshold negative charge) the cell 100 stores a logical one, but if the floating gate 115 does not store electrons the cell 100 stores a logical zero. For example, to store a logical zero, the memory system controls the voltages such that electrons accumulate on the floating gate 115. However, to store a logical one (or to erase the cell), the memory system controls the voltage to drain electrons out of the floating gate 115. Put differently, the floating gate 115 can have an uncharged and charged state which determines the data bit stored in the cell 100.

When reading from the floating gate 115, the charge stored in the floating gate 115 determines if an electrical path is formed between the source 125 and drain 120 in the channel 130. For example, if the floating gate 115 stores electrons, this charge may prevent the channel 130 from forming a conductive path. As a result, current does not flow between the source 125 and drain 120. However, if the floating gate 115 does not store charge, then the voltage on the control gate 105 causes a conductive path to form in the channel 130 between the source 125 and drain 120 thereby permitting current to flow. By determining whether current does or does not flow, the memory system can determine the state of the floating gate 115—i.e., charged or uncharged—and thus, the data bit stored in the cell 100.

In one embodiment, the memory system uses a program request to write data to the memory cell 100. However, before writing data, the memory system may first perform an erase step to remove (or at least reduce) any charge previously stored in the floating gate 115. Once the erase step is performed, the desired data bit is written in the cell 100 as explained above. For example, if the data bit is a logical zero, the memory system injects electrons into the floating gate 115 using, for example, hot electron injection or Fowler-Nordheim tunneling. However, if the cell 100 should store a logical one, the memory system may keep the floating gate in the uncharged state after the cell 100 was erased.

Figure 2:
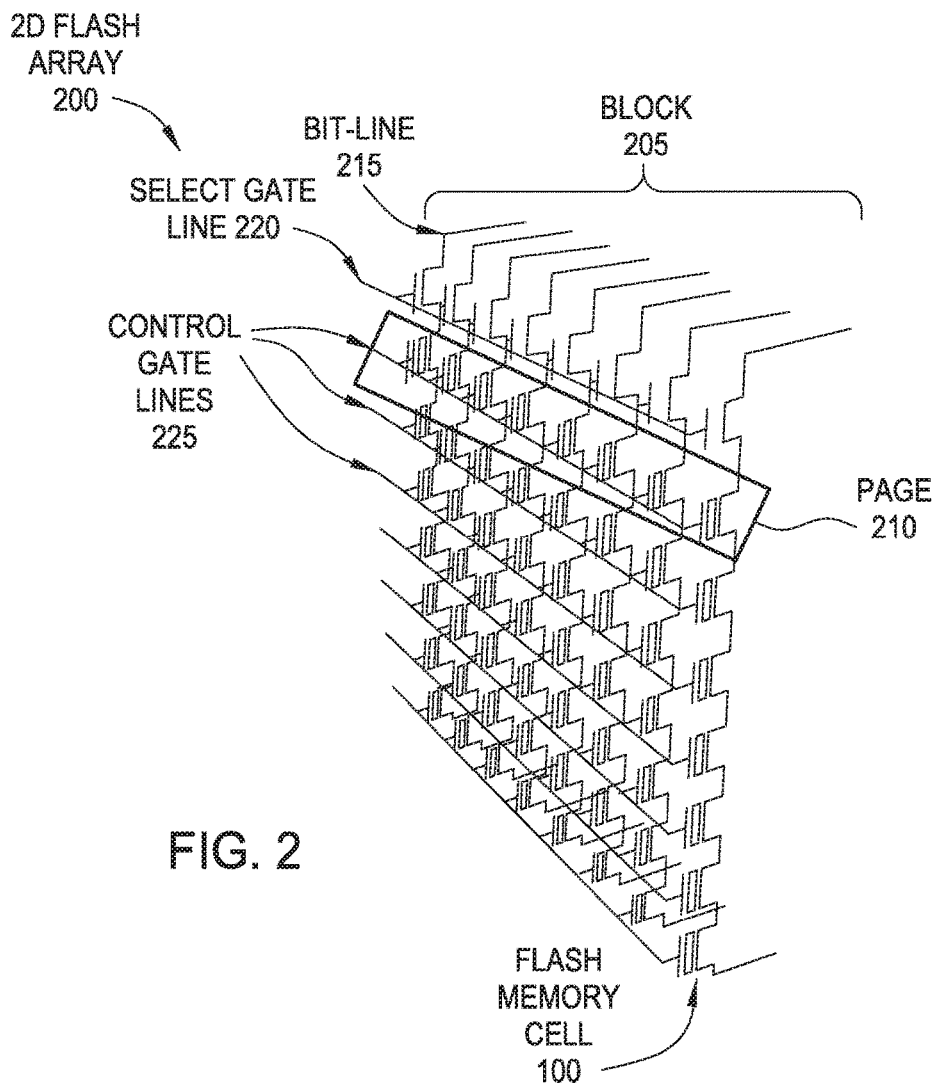
FIG. 2 is a schematic of a 2D NAND flash array, according to one embodiment described herein.

FIG. 2 is a schematic of a 2D NAND flash array 200 which illustrates one block 205 in a flash memory chip. The flash memory chip may include multiple blocks that are each separately addressable. The block 205 is divided into different pages 210 which correspond to rows in the block 205. The array 200 includes bit-lines 215, select gate lines 220, and control gate lines 225 which can be used when reading data from, and writing data to, the pages 210 in the block 205. The data stored in a particular page 210 can be read out in parallel from the block 205. For example, the control gate line 225 corresponding to the desired page 210 is selected while the other gate lines 225 are deselected. Put differently, the control gate lines 225 serve as word lines that permit the memory system to select one of the pages 210 or rows in the array 200. By measuring the current flowing through the bit-lines 215, the memory system can determine the data bit stored in each of the cells 100. Moreover, the cells 100 in the selected page 210 can be read in parallel.

When writing to a page 210, in one embodiment, the array 200 activates the select gate line 220 which permits the voltages on the bit-lines 215 to reach the pages 210 below. By activating the control gate lines 225, the array 200 determines which page 210 is being updated. Put differently, the control gate lines 225 are synchronized with the voltages on the bit-lines 215 to ensure the correct data is written into the corresponding page 210. Similarly, the voltages on the bit-lines 215 can be controlled to erase the data stored in the pages 210. That is, the voltages on the control gate lines 225 and the bit-lines 215 can be set to erase the data already stored in the cells 100—e.g., remove charge stored in the cells 100.

Figure 3:
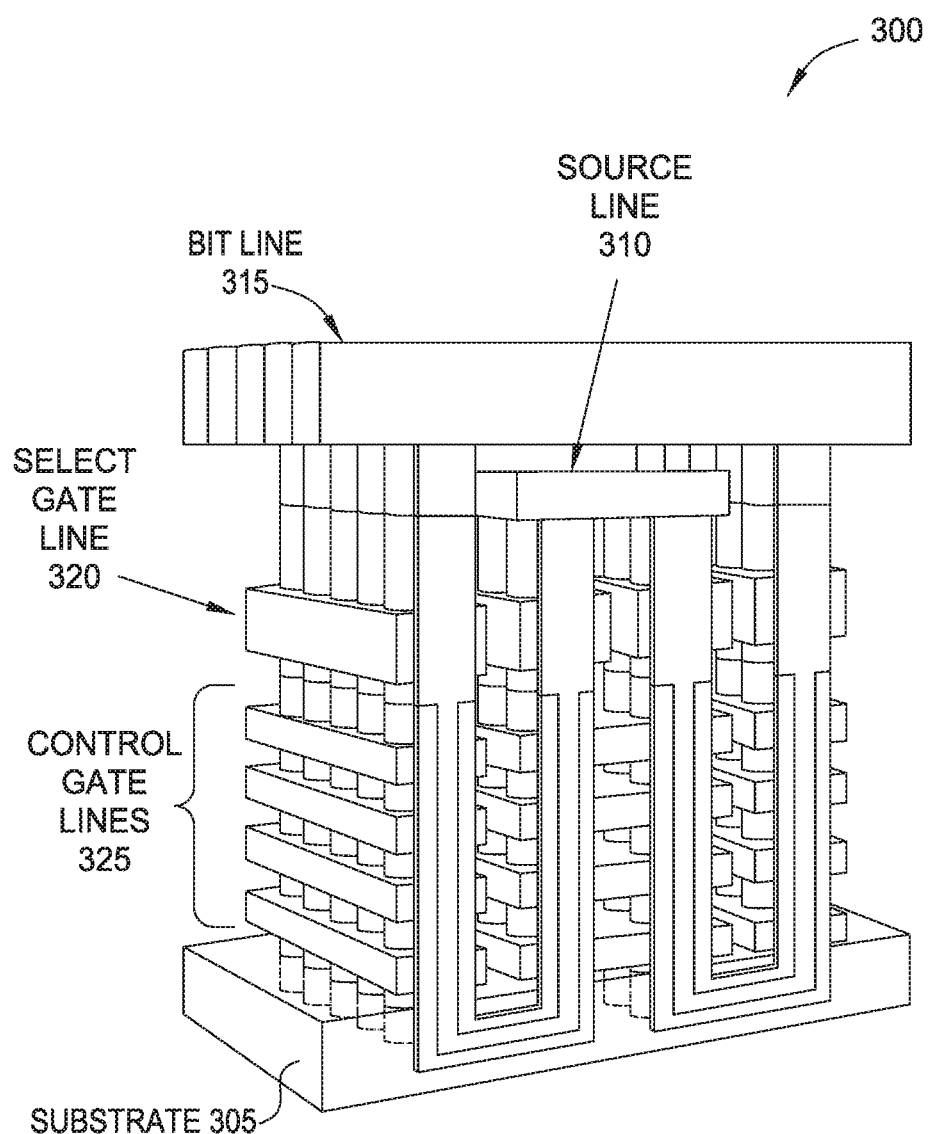
FIG. 3 is a schematic of a 3D NAND flash array, according to one embodiment described herein.

FIG. 3 is a schematic of a 3D NAND flash array 300. The array 300 is formed on a substrate 305 that provides support for stacking the various memory cells in the array 300 in a direction perpendicular to the substrate 305. That is, unlike the 2D array 200 in FIG. 2 that is parallel with a substrate, the 3D array 300 includes memory cells that extend in a direction away from the substrate 305.

The array 300 includes source lines 310 and bit lines 315 which couple to the stacked memory cells. The select gate lines 320 and control gate lines 325 permit data to be read from, and written into, the cells via the source lines 310 and bit lines 315. The general operations of the 3D flash array 300 are similar to the operations of the 2D array, and thus, are not repeated here.

Figure 4:
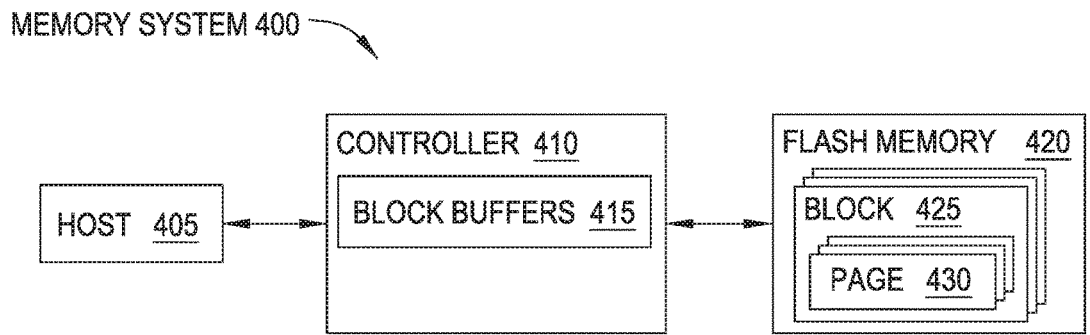
FIG. 4 is a block diagram of a flash memory system for buffering program requests, according to one embodiment described herein.

FIG. 4 is a block diagram of a flash memory system 400 for buffering program requests. The system 400 includes a host 405, a controller 410, and a flash memory 420. The host 405 may be any computing device—e.g., a mobile phone, server, laptop, tablet, desktop, and the like which transmits requests to store or retrieve data from the flash memory 420. For example, the host 405 may include an operating system or hypervisor that uses the controller 410 in order to store and retrieve data from the flash memory 420. Although the controller 410 and flash memory 420 are shown as being separate from the host 405, in one embodiment, the host 405, controller 410, and flash memory 420 may all be contained within the same enclosure.

The controller 410 is a memory controller that transmits read and program requests to the flash memory 420 in response to the instructions received from the host 405. In one embodiment, the controller 410 is a hardware controller disposed in an integrated circuit. The controller 410 maps data addresses received from the host 405 to locations in the flash memory 420 such as a particular block 425 or page 430 within the memory 420. After performing a read request, the controller 410 forwards the data retrieved from the flash memory 420 to the host 405.

The controller 410 includes multiple block buffers 415 for storing program requests to the blocks 425 in the flash memory 420. In flash memory 420, performing a program request may require substantially more time to complete than a read request. For example, the controller 410 and the flash memory 420 can perform a read request in less than a few micro seconds but a program request may require 25 milliseconds to complete. This large disparity in execution time of these requests is mainly attributable to performing the erase step of the program request. That is, the program request is performed in two steps. First, the block 425 at which the data is to be stored is erased and then the new data is written into the block 425. While writing the data can takes less than 500 micro seconds, erasing the block 425 can take milliseconds to complete. Thus, the total time taken by a program request can be several milliseconds which is orders of magnitude longer than a read request.

For read intensive applications executing on the host 405 which generate more read requests than program requests, delaying or queuing the program requests may improve the overall performance of the memory system 400. For example, an application may generate read and program requests in a ratio of 9:1. If the controller 410 executes a program request once it is received from the host 405, this means any read requests to the same block 425 corresponding to the program request cannot be performed until the program request is completed. As mentioned above, the program request can take a hundred times longer than the read request to complete in this embodiment. Instead, the controller 410 uses the block buffers 415 to store or queue program requests to the blocks 425. As described below, the controller 410 waits until a predefined threshold of program requests are received for a block 425 and then executes the program request in parallel. While the program requests are delayed, the read requests can continue to be performed. For read intensive applications, this tradeoff may improve overall system performance. Moreover, although FIG. 4 illustrates the block buffers 415 as a single unit of memory in the controller 410, in other examples, the buffers 415 may be separate registers of separate memory units.

The flash memory 420 may be either 2D or 3D NAND flash memory 420. Moreover, in one embodiment, the memory 420 is NAND flash memory 420 arranged in similar manner as shown in FIG. 2 or 3.

Figure 5:
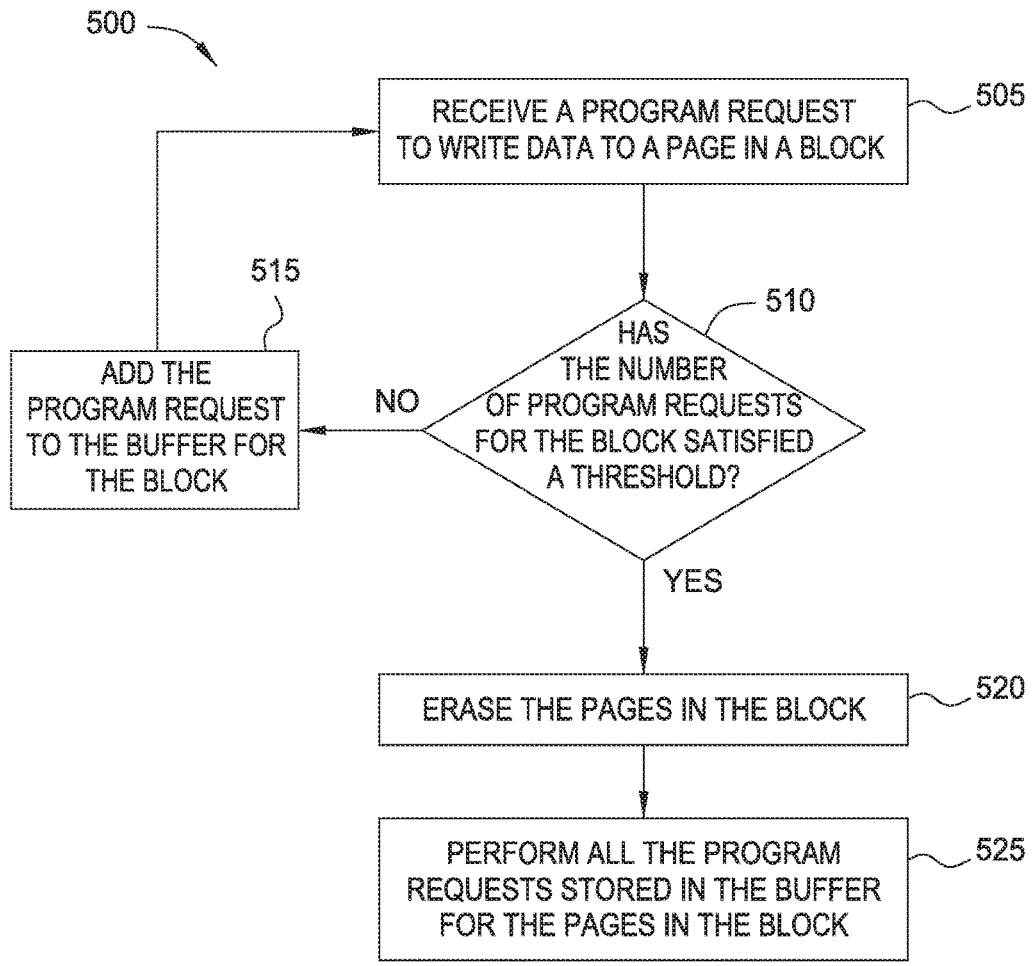
FIG. 5 is a flow chart for buffering program requests, according to one embodiment described herein.

FIG. 5 is a flow chart of a method 500 for buffering program requests. Method 500 begins at block 505 where the controller receives (or generates) a program request to write data to a page in a block in the flash memory. However, instead of executing the program request by providing instructions or commands to the flash memory, at block 510, the controller determines whether the number of program requests for the block has satisfied a threshold. In one embodiment, the threshold is the total number of received program requests for the particular block. In this example, the controller waits until 10 or 20 program requests for the block are stored in the buffer corresponding to the block before executing the requests. In another embodiment, the threshold is a percentage of pages altered by the program requests. Here, the controller queues program requests for a block until the program requests write new data into, for example, 50% of the pages in the block.

The specific value of the threshold may vary depending on the application. For example, applications that have greater read requests to program requests ratios may have higher thresholds. That is, if an application has a ratio of 9:1 rather than 5:1, the controller may wait to execute the queued program requests until they change the data in 50% of the pages rather than 30% of the pages. In one embodiment, the controller may dynamically change the threshold corresponding to the buffers depending on which application the host is executing. Stated differently, since multiple applications may access the flash memory 420, the controller may change the threshold depending on which application submits the program request. When the application with a 5:1 ratio submits program requests, the controller uses a lower threshold than when the application with a 9:1 ratio submits the program requests. In one embodiment, the host may inform the controller which application is currently submitting requests to the controller.

If the program requests for the block do not satisfy the threshold, method 500 proceeds to block 515 where the received program request is stored in the buffer for the block. That is, each block in the flash memory corresponds to a buffer—e.g., a portion of memory—where the program requests are queued until the threshold has been satisfied.

However, if the threshold is satisfied, method 500 proceeds to block 520 where the controller forwards all the program requests stored in the block buffer to the flash memory for execution. When performing the program requests, the flash memory may first erase the data previously stored in the block. In one embodiment, the flash memory erases all of the pages in the block, regardless whether those pages are going to store new data.

At block 525, the flash memory completes all the program requests stored in the buffer for the pages in the block. For example, if the controller waited until the program requests alter 50% of the pages in the block, then at block 525, the flash memory writes new data into 50% of the pages in the block. However, if the erase step performed at block 520 erases all of the pages in the block (rather than only the half of the pages changed by the program requests), the flash memory rewrites the original data in the other half of the pages.

One advantage of waiting to perform the queued program requests in parallel is that only one erase step is performed before the data corresponding to the program requests is written into the pages of the block. That is, instead of performing the program requests as they are received (which means a separate erase is performed for each program request), here, the block is erased only once. As mentioned above, erasing the block is typically the longest part of executing a program request. With method 500, the erase is performed only once rather than each time a program request is received.

Method 500 may be performed on either a 2D or 3D flash memory array. Because memory accesses are performed as a block, delaying the program requests means that read requests to those blocks can be performed until the number of program requests satisfies the threshold. Once satisfied, the flash memory can execute the program requests after the block has been erased.

Figure 6:
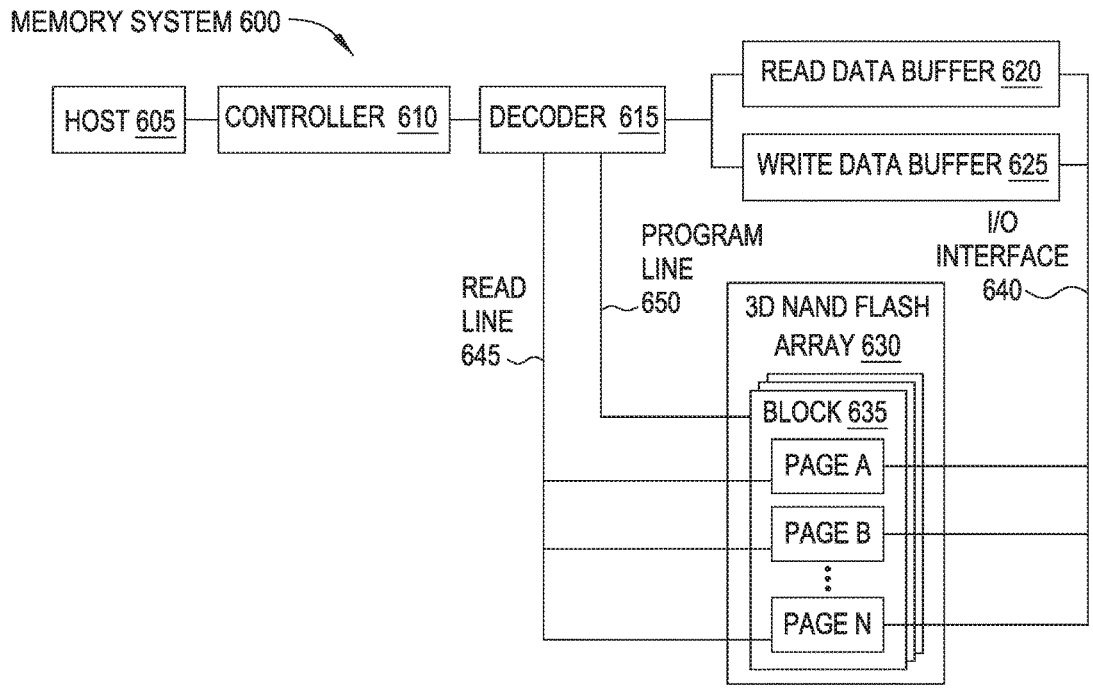
FIG. 6 is a block diagram of a flash memory system for performing read and program requests in parallel, according to one embodiment described herein.

FIG. 6 is a block diagram of a flash memory system 600 for performing read and program requests in parallel. As shown, memory system 600 includes a host 605, a controller 610, a decoder 615, buffers 620 and 625, and a 3D NAND flash array 630. The host 605 and controller 610 may be similar to the host 405 and controller 410 described in FIG. 4. However, the controller 610 may not include the block buffers for performing method 500 shown in FIG. 5. That is, although controller 610 can be configured to perform method 500 by queueing program requests to blocks 635 in array 630, it is not necessary for the embodiment that follow that it does so.

The controller 610 is coupled to decoder 615. Generally, the decoder 615 receives the read and program requests from the controller 610. Unlike in 2D flash memory, here, the memory system 600 includes separate command lines 645 and 650 for instructing the flash array 630 to perform a read request or a program request. Conversely, if only one control line is used, one state would indicate a read request while another state indicates a program request, and as such, only one block 635 can perform a read or program request at a time. That is, if there is only one command line, then only one block 635 in the array 630 can be performing a request at any given time. However, the third dimension added by using the 3D array 200 permits a separate read command line 645 and program command line 650. Thus, the read line 645 and program line 650 can be activate simultaneously which permits simultaneous reads and writes to different blocks 635 in the array 630. That is, instead of either performing a read or performing a write on one block 635 at a time, the lines 645 and 650 permit the flash array 630 to read from a page in one of the blocks 635 while performing a program request on another block 635. As shown, the read command line extends to all the pages in each of the blocks 635, while the program command line 650 extends between the blocks 635.

The flash array 630 includes an input/output (I/O) interface 640 for transmitting the data read from the blocks 635 to a read data buffer 620 and for transmitting the data to be written into the blocks 635 from a write data buffer 625 to the destination page.

Figure 7:
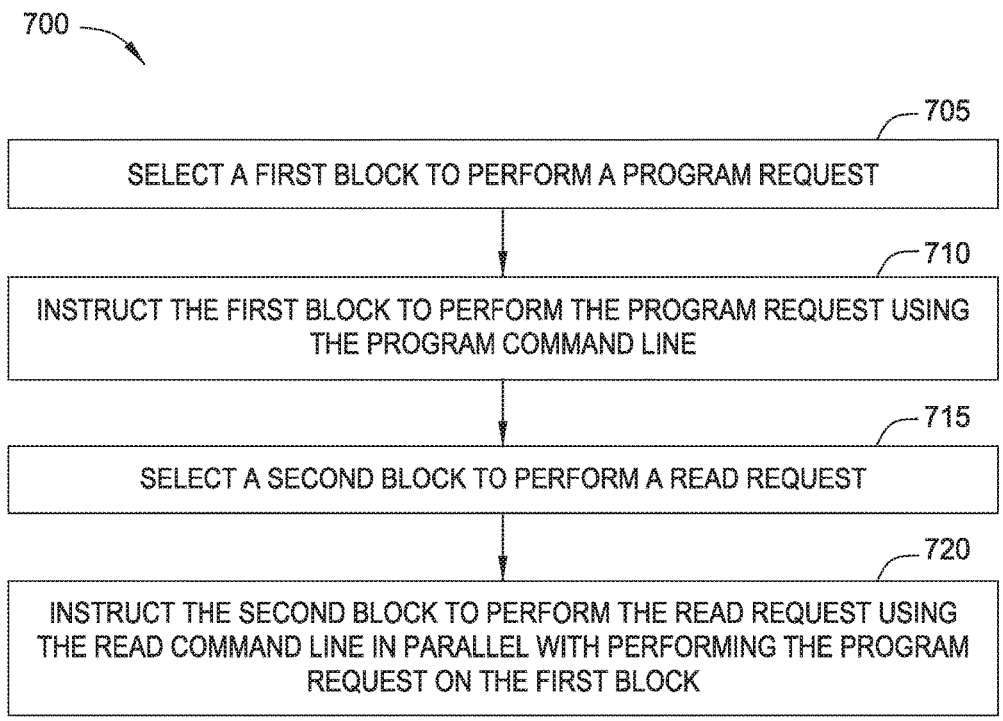
FIG. 7 is a flowchart for performing read and program requests in parallel, according to one embodiment described herein.

FIG. 7 is a flowchart of a method 700 for performing read and program requests in parallel. At block 705, the controller selects a first block on which to perform a program request. At block 710, using the program command line, the decoder instructs the first block to perform the program request. Because the program command line connects to each of the blocks in the 3D flash array, the decoder can use this command line to instruct the selected block (i.e., the first block) to perform the program request. In one embodiment, as explained above, the controller may wait until a threshold number of program requests for the first block is reached before instructing the decoder to initiate the program request; however, this is not a requirement.

When performing the program request (or a plurality of queued program requests), the flash array erases the first block. In one embodiment, the decoder activates the program line to the block which instructs the flash memory to erase one or more of the pages in the block. In one embodiment, all of the pages in the block are erased when the program line is activated.

At block 715, the controller selects a second block in the 3D flash array to perform a read request. At block 720, using the read command line, the decoder instructs the flash array to perform the read request on the second block in parallel with performing the program request on the first block. As shown in FIG. 6, the read command line 645 couples to each of the pages in the blocks 635 which enables the decoder 615 to select one of the pages to output its data using the I/O interface 640. Thus, in this manner, the 3D flash array can write data to a first block while simultaneously reading from a page in a second block using the separate read and program command lines.

Because a read request takes substantially less time than a program request, the controller may perform multiple read requests while the first block is performing the program request. For example, the read request to the second block may finish while the first block is still being erased in response to the program request. Once the read request to the second block is finished, the controller can instruct the decoder to perform another read request. In response, the decoder can use the read command line to read data from a different page in the second block or read data from another block in the flash array. That is, the flash array can read data from any block except for the block currently performing the program request. In this manner, the flash array can perform multiple read requests while performing one program request.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A memory system, comprising:
   a NAND flash memory array comprising a plurality of data blocks that each includes a plurality of pages;
   a controller configured to:
      receive a program request to write data into a first block of the data blocks;
      evaluate the program request and a plurality of previously queued program requests to determine if a threshold corresponding to the first block is satisfied, wherein each of the plurality of previously queued program requests writes data to the first block; and
      execute the program request and the plurality of queued program requests only upon determining the threshold is satisfied, wherein, upon determining the threshold is satisfied, the NAND flash memory array is configured to erase all the pages in the first block and re-write the pages in the first block to include updated data provided by the program request and the previously queued program requests, and wherein after re-writing the pages in the first block, a first portion of the pages in the first block contain previously written data and a remaining portion of the pages in the first block include the updated data.

2. The memory system of claim 1, wherein the controller is configured to:
   store the program request in a buffer corresponding to the first block if the threshold is not satisfied, wherein the program request is queued along with the plurality of previously queued program requests waiting for execution.

3. The memory system of claim 2, wherein the controller is configured to:
   maintain a respective buffer for each of the data blocks; and
   execute queued program requests stored in the respective buffers only after a number of program requests received by the controller corresponding to one of the data blocks exceeds a respective threshold.

4. The memory system of claim 1, wherein the first block is erased only once when executing the program request and the plurality of previously queued program requests.

5. The memory system of claim 1, wherein the threshold is based on at least one of: (i) a percentage of pages in the first block updated by the data provided the program request and the plurality of queued program requests and (ii) a combined number of received program requests to write data in the first block.

6. A method of operating a NAND flash memory comprising a plurality of data blocks that each includes a plurality of pages, the method comprising:
- receiving a program request to write data into a first block of the data blocks;
- evaluating the program request and a plurality of previously queued program requests to determine if a threshold corresponding to the first block is satisfied, wherein each of the plurality of previously queued program requests writes data to the first block; and
- executing, upon determining the threshold is satisfied, the program request and the plurality of queued program requests, wherein executing the program request and the plurality of queued program requests comprises erasing all the pages in the first block and re-writing the pages in the first block to include updated data provided by the program request and the previously queued program requests, and wherein after re-writing the pages in the first block, a first portion of the pages in the first block contain previously written data and a remaining portion of the pages in the first block include the updated data.

7. The method of claim 6, further comprising:
- receiving a second program request to write data into the first block;
- evaluating the second program request and the plurality of previously queued program requests to determine if the threshold corresponding to the first block is satisfied; and
- storing, upon determining the threshold is not satisfied, the second program request in a buffer corresponding to the first block, wherein the second program request is queued along with the plurality of previously queued program requests waiting for execution.

8. The method of claim 7, further comprising:
- maintaining a respective buffer for each of the data blocks; and
- executing queued program requests stored in the respective buffers only after a number of received program requests corresponding to one of the data blocks exceeds a respective threshold.

9. The method of claim 6, wherein the first block is erased only once when executing the program request and the plurality of previously queued program requests.

10. The method of claim 6, wherein the threshold is based on at least one of: (i) a percentage of pages in the first block updated by the data provided the program request and the plurality of queued program requests and (ii) a combined number of received program requests to write data in the first block.

11. An integrated circuit, comprising:
- a controller configured to:
  - receive a program request to write data into a first block of data blocks in a NAND flash memory;
  - evaluate the program request and a plurality of previously queued program requests to determine if a threshold corresponding to the first block is satisfied, wherein each of the plurality of previously queued program requests writes data to the first block; and
  - execute the program request and the plurality of queued program requests only upon determining the threshold is satisfied, wherein, upon determining the threshold is satisfied, the controller is configured to instruct the NAND flash memory to erase all the pages in the first block and to instruct the NAND flash memory to re-write the pages in the first block to include updated data provided by the program request and the previously queued program requests, and wherein after re-writing the pages in the first block, a first portion of the pages in the first block contain previously written data and a remaining portion of the pages in the first block include the updated data.

12. The integrated circuit of claim 11, wherein the controller is configured to:
- store the program request in a buffer corresponding to the first block if the threshold is not satisfied, wherein the program request is queued along with the plurality of previously queued program requests waiting for execution.

13. The integrated circuit of claim 12, wherein the controller is configured to:
- maintain a respective buffer for each of the data blocks; and
- execute queued program requests stored in the respective buffers only after a number of program requests received by the controller corresponding to one of the data blocks exceeds a respective threshold.

14. The integrated circuit of claim 11, wherein the first block is erased only once when executing the program request and the plurality of previously queued program requests.

* * * * *